United States Patent [19]

Goulstone et al.

[11] Patent Number: 4,558,581

[45] Date of Patent: Dec. 17, 1985

[54] GUIDING AN ADVANCING STRIP

[75] Inventors: Ray T. Goulstone; Michael T. Gursky, both of Allentown; John M. O'Boyle, Bethlehem, all of Pa.

[73] Assignee: AT&T Technologies, Inc., Berkeley Heights, N.J.

[21] Appl. No.: 533,029

[22] Filed: Sep. 16, 1983

[51] Int. Cl.⁴ .................... B21C 37/02; B21C 47/34; B26D 7/14

[52] U.S. Cl. ........................................ 72/379; 72/428; 83/176; 226/88; 493/409; 493/434; 493/439

[58] Field of Search ................ 72/176, 129, 428, 130, 72/379, 250, 206, 405, 181; 226/88, 1, 6, 59, 86; 83/176, 444, 446, 440, 442; 493/436, 434, 438, 439, 442, 443, 446, 965, 178; 156/199, 200; 29/400 RL

[56] References Cited

U.S. PATENT DOCUMENTS

| | | | |
|---|---|---|---|
| 1,317,581 | 9/1919 | Kipniss | 72/181 |
| 1,909,504 | 5/1933 | Robbins | 226/88 |
| 1,990,255 | 2/1935 | Sonntag | 72/176 |
| 2,493,056 | 1/1950 | Bartelson | 226/59 |
| 2,629,422 | 2/1953 | Erickson | 72/181 |
| 2,708,511 | 5/1955 | Wilson | 72/206 |
| 3,119,432 | 1/1964 | Rogers | 72/176 |
| 3,119,534 | 1/1964 | Lehnert | 226/1 |
| 3,204,328 | 9/1965 | Klasek | 29/882 |
| 3,874,576 | 4/1975 | Vines | 226/59 |
| 3,897,943 | 8/1975 | Head et al. | 493/434 |
| 3,914,971 | 10/1975 | Colbath | 72/181 |
| 4,227,983 | 10/1980 | Gursky et al. | 226/1 |

FOREIGN PATENT DOCUMENTS

502038 7/1930 Fed. Rep. of Germany ........ 72/176
1182946 3/1970 United Kingdom .................. 72/428

Primary Examiner—Lowell A. Larson
Attorney, Agent, or Firm—D. C. Watson

[57] ABSTRACT

A strip (10) of delicate foil is advanced longitudinally along a substantially flat path such as along a platen (104) for printing patterns of lead clusters (12) in photoresist on the foil. A margin (28) of strip (10) is formed into a guiding member such as a standing ridge (98), leaving a residue portion (29) in a desirably flat condition. Ridge (98) has a convenient reference edge (102) and a structural angle is formed by ridge (98) with adjacent foil portions. Such angle is sufficiently strong that advancing strip (10) receives no unacceptable deformation as the reference edge (102) is contacted such as to a reference wall (100) for guidance. Strip (10) is biased so the reference edge (102) maintains contact with guiding apparatus so located that the strip follows the desired path. For example, a flat member (122) is biased downward upon the residue portions (29) of strip (10) and the flat path while a side of member (122) is biased against ridge (98) and the reference wall (100). When portions of strip (10) have been printed, the margin (28) may be returned downward and again made coplanar with the residue portion (29) so strip (10) may be wound upon a reel (62).

6 Claims, 8 Drawing Figures

GUIDING AN ADVANCING STRIP

TECHNICAL FIELD

This invention relates to advancing and guiding a strip longitudinally along a desired path. More particularly, strips of delicate copper foil are made into carrier tape for semiconductor devices, and this invention relates to advancing and guiding such strips for treatment such as mask printing.

BACKGROUND OF THE INVENTION

Thin ribbons of finely patterned foil, referred to as carrier tapes, are utilized in the semiconductor industry to assemble components such as integrated circuit chips into service packages. A tape has separate clusters of soft, inner leads to which respective chips are bonded and thereby carried for further assembly. Later the tape donates each cluster as a chip is removed and the inner leads are bonded to heavier, outer leads for service connection.

Each lead in a cluster on a tape should be precisely placed and the edges of the leads should be sharp and carefully delineated. Otherwise, registration of leads-to-pads on a chip or of leads-to-leads will be adversely affected in a bonding operation. A problem is that the placement of leads is becoming more precise and the leads in a cluster are increasing in number.

The fine and precise line work required to form such tapes is typically accomplished utilizing photolithographic techniques. A typical technique involves coating a conductive strip of foil, printing latent images in the coating, developing the images to expose unwanted foil and etching to remove such foil. Perhaps the most challenging step is the one of properly printing latent images of the leads in the coating.

A master mask containing a pattern of lead clusters is prepared, typically utilizing a laser machine controlled by a computer. The mask is mounted in a printing machine within a platen forming a path over which a strip will travel. The printer also includes strip handling apparatus, an intense light source and a system of controls.

A strip of conductive foil is coated with a light-sensitive material which is normally resistant to etchants. The coated strip is then indexed on a step and repeat basis over the path containing the mask. At each step a pattern is printed on a portion of strip, then the strip is indexed a precise distance and a next pattern is printed. A problem is to match the end of a preceding pattern to the beginning of a next pattern. Another problem is to align a series of such patterns so they follow a substantially straight reference datum. Such problems relate in part to the material of the strip and to the apparatus for handling such strip.

Preferably, such material is very thin which promotes good bonding and enhances temperature cycling tests of completed devices. Typically, high conductivity copper foil is utilized and annealed to a "dead soft" condition. Such foil is delicate and readily wrinkled, warped or otherwise distorted in handling.

The apparatus for handling thin strips includes reels, rollers and guides. A problem is that reels and rollers alone do not prevent a strip of foil from wandering about a straight line on a printing platen. The mask is typically set with respect to a reference centerline extending through the platen. Reels at each end of the platen are set to bias edges of a strip about the reference centerline. However, a strip of the type described is too weak to tolerate biasing pressure to guide in the manner described with the required precision. The guided edge of the strip has a tendency to crimp and tear and/or to misalign the residue portion of strip where printing takes place.

Accordingly, it is desirable to develop new and improved expedients for advancing and guiding a strip. It is particularly desirable to guide delicate strips of metallic foil such as thin strips of fully annealed copper utilized to make carrier tape. Such strips should be guided longitudinally and precisely along a given path, preferably by contacting along only one edge as a strip is advanced on a step and repeat basis. The strips and the tapes developed therefrom are further processed with facility on reels having wide flanges. Accordingly, any expedients for guiding should include restoring the strip to a condition amenable to winding the strip upon a reel.

SUMMARY OF THE INVENTION

Expedients are provided to guide a strip advancing longitudinally along a desired path such as along a platen for photolithographic printing. Typically, the strip is made of flat copper foil and a marginal portion is formed into a guiding member such as a standing ridge to guide and protect flat, residue portions of foil. The standing ridge has a desirably straight reference edge along its juncture with the residue foil. Also, such ridge forms an angle with the foil of sufficient strength that the advancing strip receives no further deformation as the reference edge is contacted for guiding. Conveniently, a substantially flat member is utilized to bias the advancing strip so the reference edge maintains contact with guiding apparatus. For example, the strip is supported for printing along a substantially flat platen containing a mask. The platen is coextensive with and spatially related to an adjacent wall utilized as a reference datum for laterally guiding the strip. The flat, biasing member bears upon the flat, residue portions of foil and onto the platen while the side of the member is biased against the standing ridge and onto the reference wall. After portions of strip have been printed, the standing ridge may be turned downward and made coplanar with the residue foil so the strip may be wound upon a reel for handling.

BRIEF DESCRIPTION OF THE DRAWING

The invention will be more readily understood from the following detailed description when read in conjunction with the drawing wherein.

Some of the elements in the figures are abbreviated or simplified to highlight features of the invention. Also, where appropriate, reference numerals have been repeated in the figures to designate the same or corresponding features in the drawing.

DETAILED DESCRIPTION

The Strip

Figure 1:
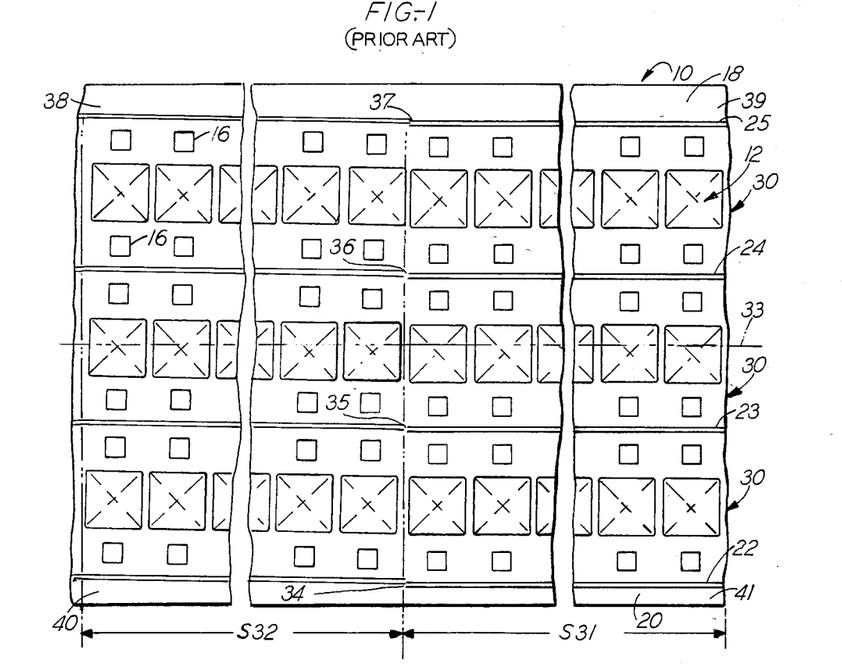
FIG. 1 is a plan view of a strip illustrating patterns and problems in the prior art.
Figure 1A:
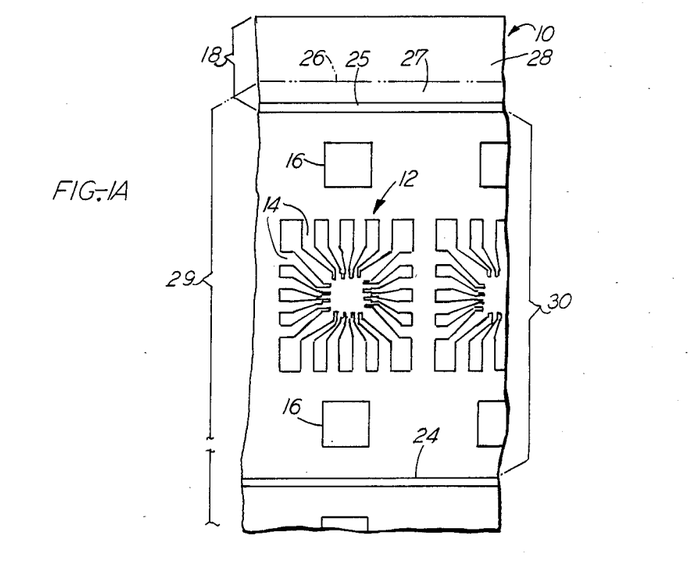
FIG. 1A is a plan view of an enlarged portion of the strip shown in FIG. 1 wherein a crimping line is included according to the instant invention.

FIG. 1 is a plan view of a strip 10 showing typical patterns and problems in the art of making carrier tape. FIG. 1A is a plan view of a portion of strip 10 which has been greatly enlarged to show features of a lead cluster, other items in a pattern and a crimping line utilized in the instant invention. It is assumed in both figures that strip 10 has been coated, printed and the printing has been developed so a pattern is visible to one's eye.

The pattern in strip 10 includes a cluster 12 of finger-like leads 14 (FIG. 1A), called inner leads in the art. Each lead 14 has free ends projecting toward the center of a respective cluster 12 and opposite ends affixed to the strip 10. A center portion of each cluster 12 is open to accept a chip (not shown) which has bonding pads, each corresponding to a respective free end of a lead 14.

In the instant strip 10, each cluster 12 has sixteen leads corresponding to sixteen pads on a chip. Once a chip is bonded to a cluster 12, it is carried thereby until all sixteen leads are sheared out of a cluster 12 and bonded to an array of stiff leads, called outer leads in the art. The chip is carried therewith into a package and the outer leads are ultimately inserted into a circuit pack.

Other items in a pattern include sprocket holes 16 which are provided on either side of a cluster 12 for indexing a tape during a further operation such as bonding. Strip 10 has other advantageous features which are convenient for processing the strip through subsequent developing, etching and rinsing steps. For example, marginal portions 18 and 20 (FIG. 1) are provided for multiple purposes. Margin 20 is a narrow margin which is provided for delineating purposes. Margin 20 is separated from an adjacent row of lead clusters (and sprocket holes) by a stripe 22 which bears a precise relationship to the pattern, including stripes 23, 24 and 25 to be explained hereinafter. The margin 20 is not so precisely dimensioned in width because the raw edge of a strip 10 does not typically uniformly follow a straight line.

Margin 18 is wider than margin 20 and serves purposes other than just the delineating function described for margin 20. For example, it has been found advantageous to utilize margin 18 to grip and drive a strip while patterns thereon are being processed. Such expedients are fully set forth in U.S. Pat. Nos. 4,227,983; 4,286,860; 4,339,296 and 4,320,192; all of which are assigned to the assignee of this application.

FIG. 1A also discloses a theoretical line 26 drawn in phantom style which will also be referred to herein as a crimping line 26. Line 26 divides margin 18 in two portions wherein a portion 27 serves to delineate one side of the pattern. The other portion 28 is utilized during the printing operation for guiding purposes. Margin 28 is advantageously formed into a standing ridge by crimping along line 26 in accordance with the instant invention. For purposes of discussion, all portions transversely of the strip 10 which are not included in guiding margin 28 will be referred to hereinafter as residue portions or as the residue portion 29.

FIG. 1 shows that stripes 22–25 are drawn especially wide to assure that adequate separation will be made longitudinally of strip 10 in an etching process. It is readily seen that etching along stripes 22–25 will produce separate portions as follows: a drive margin 18, a delineating margin 20 and three ribbons containing rows of clusters 12 with accompanying sprocket holes 16. Such ribbons are called carrier tapes and are hereinafter designated generally by the numeral 30. Making such tapes 30 from the described strip 10 is a painstaking art due, in part, to the material preferred for strip 10.

One of the many tests for packaged devices determines how long a device may endure under extremes of hot and cold temperatures without breaks in the current carrying leads 14. It is known that results of such a test are enhanced when the leads 14 are made of soft metal. For this and other reasons, the basic material for strip 10 is preferably oxygen-free, high-conductivity copper sheet. Such sheet is generally referred to as foil because it is preferably only about 0.0007 inch to about 0.003 inch in thickness and weighs from about 0.5 oz. to about 2.3 ozs. per square foot. The foil is fully annealled to a condition said to be dead soft, i.e., it has no substantial resistance to bending. Strips made from such foil are delicate and become readily wrinkled, warped or otherwise distorted in handling.

Printing

Figure 2:
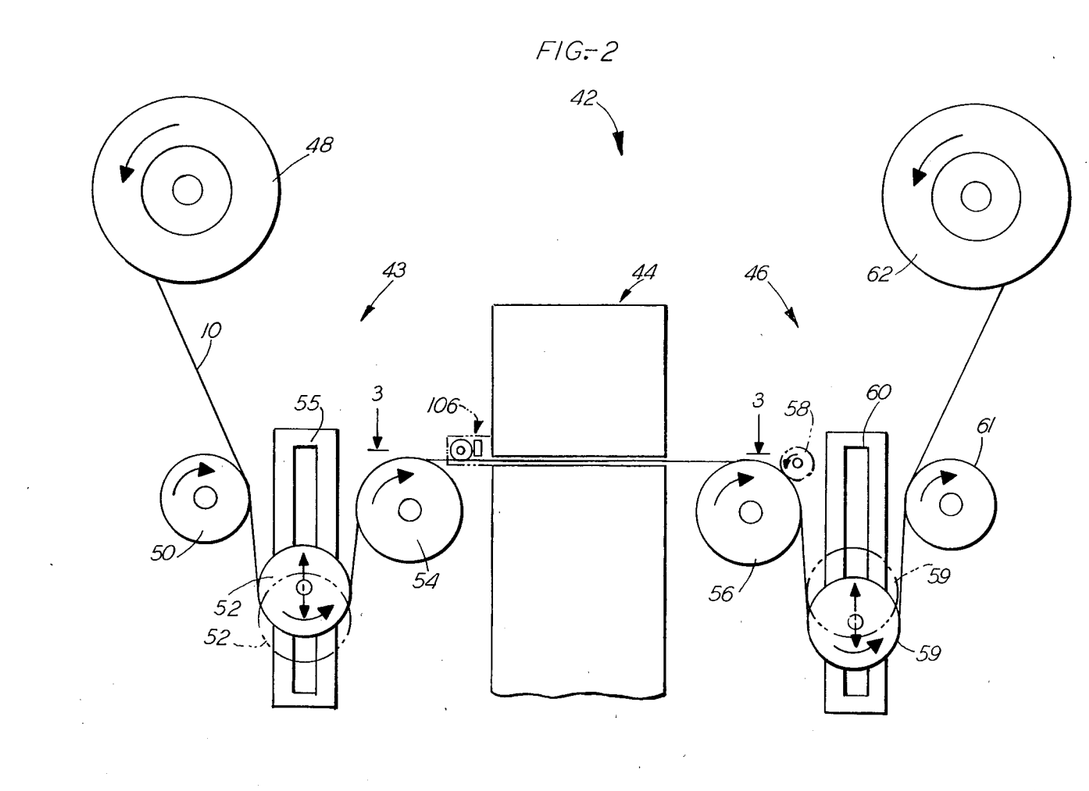
FIG. 2 is a schematic elevation of typical apparatus for printing patterns on a strip.

Apparatus for printing patterns on a strip 10 is shown schematically in FIG. 2, designated generally by the numeral 42. The strip 10 advances from a feed assembly 43 to a printing assembly 44 and then to an output assembly 46, all being generally designated in FIG. 2.

Assembly 43 includes a feed reel 48 containing strip 10 which has previously been coated top and bottom with a suitable photoresist material which is cured by heating. One such suitable coating material is available from Shipley Co., Inc., Newton, Mass. and sold under the trade designation "Shipley AZ-340B."

Coated strip 10 is advanced from feed reel 48 over an idler roller 50, then under a slack roller 52 and onto a guide reel 54. Note that slack roller 52 rotates and rides vertically up or down on a shaft which is guided by a track 55. Strip 10 advances through the printing assembly 44 where portions are exposed for printing in a manner to be explained later. Strip 10 then advances over an output driving wheel which is shown as a prior art reel 56. For purposes of the invention, reel 56 is replaced with a smooth drive roller (not shown) and an opposing roller 58 is mounted as shown in phantom lines. Strip 10 then advances under a slack roller 59 having a guide track 60, each being respectively similar in form and function to roller 52 and track 55. Strip 10 is then advanced over an idler roller 61 and is taken up on output reel 62 for further processing.

In operation of apparatus 42, strip 10 is advanced on a step and repeat basis in which each step advances strip 10 a precise distance such as S=2.8125 inches for the pattern shown in FIGS. 1 and 1A. To execute the step, reel 62 turns counterclockwise (CCW) a sufficient amount to raise pulley 59 to the position shown in phantom lines. Simultaneously therewith, reel 48 turns CCW a sufficient amount to lower pulley 52 to the position shown in phantom lines and strip 10 is then ready to be advanced.

Slack rollers 52 and 59 keep strip 10 under a desired tension so it can be advanced a precise amount by drive reel 56. Reel 56 is driven by a pulsed stepping motor wherein a given number of pulses relates to a given angle of rotation of reel 56 and to a precise advancing distance for strip 10 such as 2.8125 inches. When reel 56 rotates and advances strip 10, the slack roller 59 is lowered and slack roller 52 is raised to the position shown in solid lines. Printing assembly 44 is then actuated to print another pattern.

Figure 3:
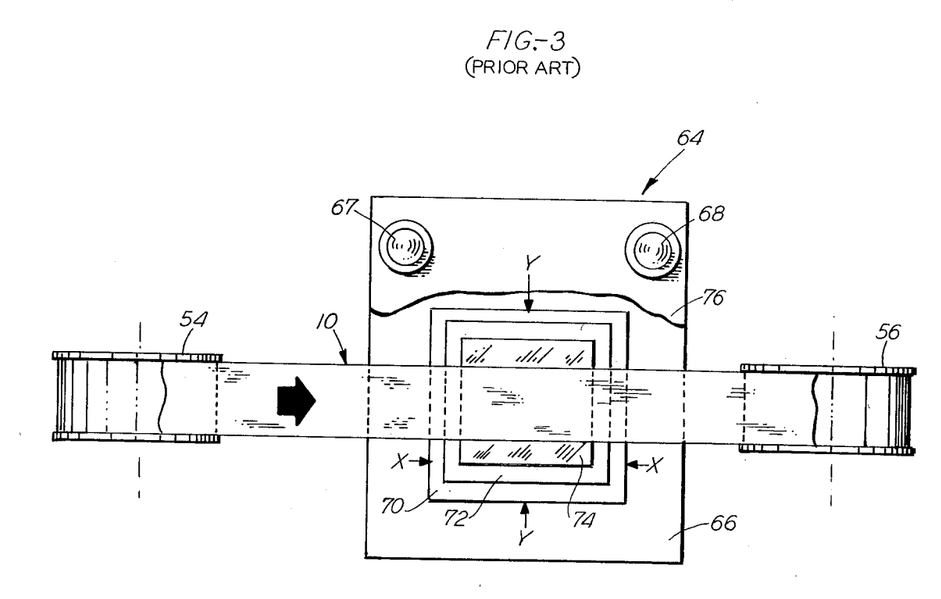
FIG. 3 is a sectional plan view of a printing platen, part of the apparatus shown in FIG. 2, taken along line 3—3.

FIG. 3 is a sectional plan view taken along line 3—3 in FIG. 2 to show a platen designated generally by the numeral 64. The term platen is used herein to describe apparatus which forms a substantially flat path for the strip 10 to advance over and be fixed upon for printing purposes. Platen 64 includes a support frame 66 which is vertically movable and guided by columns 67 and 68. On top of frame 66, there is mounted a smaller frame 70 which is horizontally adjustable in X and Y directions. On top of frame 70, there is mounted a mask holder 72 containing a printing mask 74. When a mask 74 becomes worn, the holder 72 is disconnected from adjustable frame 70 and another holder with mask affixed thereto is installed on frame 70. A pressure plate 76 is also partially seen in FIG. 3 which serves to press strip 10 onto mask 74 when printing is underway.

The relationship between guiding apparatus for strip 10 and the platen 64 is also appreciated from FIG. 3. For example, strip 10 is almost suspended between guide reel 54 and drive reel 56 when indexing takes place because frame 66 is then lowered. It is further evident that guiding is dependent upon tension of strip 10 and peripheral flanges on guide reel 54 and drive reel 56. Such guidance may be adequate for strips having edges which are uniformly straight and material which resists wrinkling, crimping, tearing and distortion. However, such guiding expedients have been found generally inadequate to guide delicate foil used for making carrier tape.

The foil typically assumes a non-linear condition when a strip is laid out on a flat surface. Often a length of strip assumes a long, gentle curve away from a straight line, a condition referred to in the art as camber. Consequently, to force such strip to follow a straight path requires that it be edge guided to slightly bend it in a plane coincident with the plane of the strip. A problem with the foil is that its resistance to bending is not substantial, nor even sufficient to withstand even the slight bending required to correct for camber. It is found that the edges ride upward onto the flanges of reels 54 and/or 56 or the edges tear or become crimped such that strip 10 wanders from a desirably straight path when it is indexed for printing.

FIG. 1 shows the results of inadequate guiding of an advancing strip 10 on which patterns are printed with errant alignment. A printed pattern extends for a given distance along strip 10 on which a first pattern is designated S31 and a next pattern is designated S32. The pattern at S31 is substantially parallel to the edges of strip 10 and properly positioned (although not symmetrical) with respect to a centerline 33. However, the pattern at S32 is angular and partially to one side of the centerline 33. Note the joints 34–37 at stripes 22–25, respectively, are crudely printed. Note also that the margin distance at 38 is less than at 39 while the opposite margin distance is greater at 40 than at 41. Such printing is unacceptable by modern standards which may require that all lines be placed within about ±0.001 inch of a desired position relative to a datum such as centerline 33.

Forming Guide Members

A solution to improving a strip of delicate foil so it may be edge guided is to make such edges strong enough to resist the forces incurred along guiding apparatus. Unfortunately, the economics of making carrier tape do not justify costly expedients. However, a convenient and inexpensive expedient is to form one or more guide members along an edge utilizing marginal portions of the strip itself. An acceptable guide member should have a preferably straight reference edge. The member should also be sufficiently strong that a guided, advancing strip 10 receives substantially no deformation except for deformation utilized in forming the member. A die for turning marginal portions of strip 10 upward to form a standing ridge to serve as a guide member is seen in FIG. 4.

A margin-turning die 75 (also referred to as a ridge forming die 75) includes a base 78 having a broad, shallow channel 80. Channel 80 has an entrance 81, an exit portion 82 and two sidewalls 83 and 84. By an exit 82 it is meant an exit from the forming portion and not an exit from channel 80. Channel 80 also has a floor 85 of sufficient width to accommodate the residue portion 29 of strip 10 desired for printing. At the intersection of sidewall 83 and floor 85, a corner line is created coincident with a line 86 which extends from the entrance 81 through the exit 82 and through the platen portion of a printer (not shown). A portion of a reference wall 100, of such platen is shown to indicate that line 86 is aligned thereto.

Line 86 also delineates one edge of floor 85 and separates the floor from a helical side surface 88 which is advantageously utilized to turn upwardly a marginal portion of strip 10. Surface 88 extends from entrance 81, where an elemental portion is coplanar with floor 85, and turns as such surface continues to about exit 82 where an elemental portion is vertically coplanar with sidewall 83. It will later be seen that sidewall 83 is a transitional extension of reference wall 100 in a printer.

Figure 4:
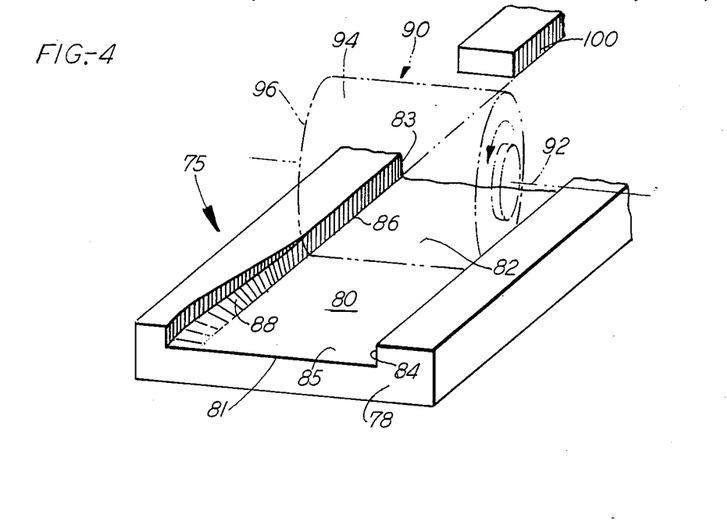
FIG. 4 is a pictorial view of a die adapted to form a marginal portion of a strip into a guide member in accordance with the invention.

Turning die 75 is illustrated without strip 10 therein for clarity in FIG. 4. However, it will be appreciated that die 75 is so disposed that the marginal portion 28 (FIG. 1A) of the advancing strip 10 engages the helical side surface 88. The intention is to turn such margin 28 along surface 88 upwardly into a standing ridge parallel to and in contact with sidewall 83. Such upwardly turning is further facilitated by means to crimp strip 10 along the crimping line 26 shown in FIG. 1A.

The crimping is advantageously done by a roller 90 shown in phantom lines in FIG. 4. Roller 90 has an axis 92 transverse to the path traversed by strip 10 and a rolling surface 94 which bears upon the residue portion 29 of strip 10. Surface 94 restrains the residue portion 29 along the floor 85 of die 75 and a peripheral edge 96 of roller 90 contacts and crimps margin 28 along line 86 of die 75.

Figure 5:
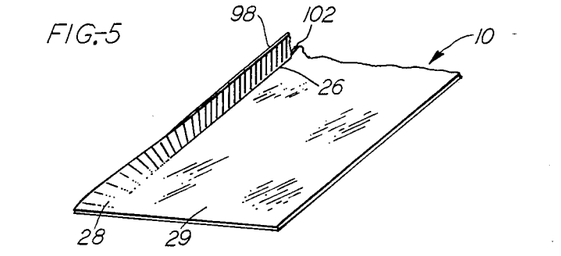
FIG. 5 is a pictorial view of a portion of a strip wherein a guide member is partially formed in accordance with the invention.

FIG. 5 shows a portion of strip 10 which has been removed from die 75 and roller 90 during an interrupted forming step. Note that forming has been initiated at a trailing end and a standing ridge 98 is fully formed from margin 28 at a leading end. Ridge 98 is crimped along and forms a lineal corner at line 26. An outside lineal corner forms a reference edge 102 opposite to line 26 for contacting purposes. Such reference edge 102, line 26 and the reference wall 100 (not shown) are spatially related to residue portion 29 on which a series of patterns will be printed. Also, the ridge 98 and adjacent sheet portions provide a structural angle to resist bending from forces applied along the reference edge 102.

Guiding Apparatus

Figure 6:
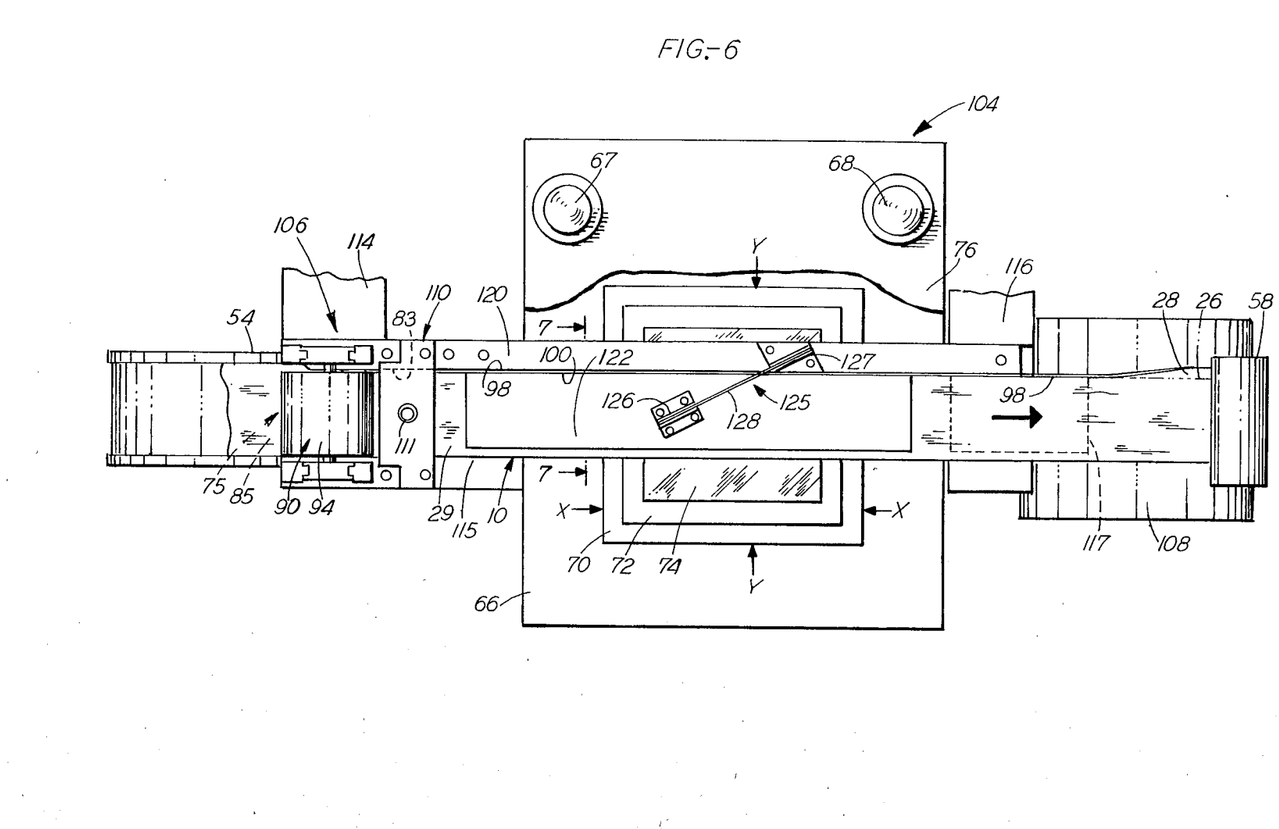
FIG. 6 is similar to FIG. 3 but apparatus is included for guiding a strip shown with a guide member in accordance with the invention.

FIG. 6 illustrates a printing platen 104 similar to that shown in FIG. 3; however, several modifications and additions have been made in accordance with the invention. Reference is also made to FIG. 2 wherein certain modifications are shown in phantom lines including the reforming roller 58 and station 106 for forming a guide member, all of which will now be explained.

FIG. 6 shows that drive reel 56 of FIGS. 2 and 3 has been replaced with a drive roller 108 which does not have flanges and, therefore, exerts substantially no lateral force against the edges of strip 10. Items 66-76 are similar to and have the same function as the same items explained for FIG. 3. The guide member forming station 106 includes the ridge forming die 75 and crimping roller 90 shown at the entrance to platen 104, each having the function explained for FIG. 4. Station 106 also includes a vacuum cleaning chamber 110 having top and bottom vacuum lines (only 111 is shown) connected to a vacuum source. In operation of chamber 110, a wiper (not shown) continuously cleans crimping roller 90 and the vacuum removes debris from the top and bottom of strip 10 prior to printing.

Between reel 54 and frame support 66, a bracket 114 supports die 75, roller 90, chamber 110 and a flat, floor member 115 which extends to about the frame support 66. Between reel 108 and frame support 66, a bracket 116 supports a floor member 117. Floor 85 of die 75, floor member 115 and floor member 117 form a flat path over which strip 10 is advanced for printing purposes. A problem is to guide strip 10 along the path so a guide member, represented by standing ridge 98, has the reference edge 102 (FIG. 5) follow a straight line.

Figure 7:
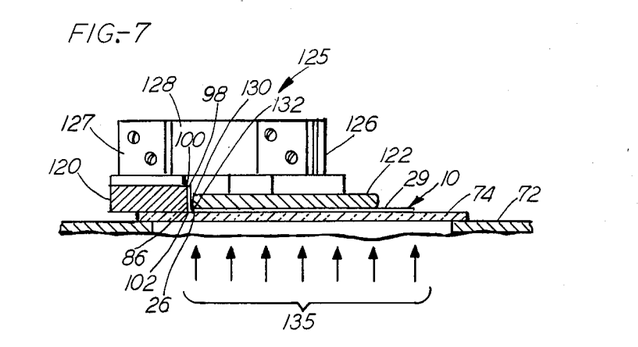
FIG. 7 is a sectional view of the platen, guiding apparatus and strip shown in FIG. 6, taken along line 7—7.

FIG. 7 is a cross-sectional view of platen 104 taken along line 7—7 in FIG. 6. FIGS. 6 and 7 show provisions in addition to the flat path, for guiding strip 10. A sturdy bar 120 extends along the rear portion of platen 104 from brackets 114 and 116. Bar 120 has the reference wall 100 mentioned previously for laterally restraining strip 10 by guiding along standing ridge 98. Wall 100 and the flat path are spatially related to each other and to mask 74 to accommodate strip 10 and the pattern desired on its residue portion 29.

Biasing Apparatus

FIGS. 6 and 7 also show expedients for biasing strip 10 against the flat path and against reference wall 100. A substantially planar member 122 is shown having a substantially flat surface in contact with residue portion 29 of strip 10. Member 122 extends over portions of the path where pressure is desired such as ahead of, upon, and just beyond mask 74. Member 122 is also substantially coextensive with the portions of wall 100 where pressure against standing ridge 98 is most beneficial.

In addition to the weight of member 122, strip 10 is also biased by a leaf spring mechanism 125 comprised of brackets 126 and 127 and a spring tempered plate 128. Brackets 126 and 127 are so adjusted that plate 128 exerts a downward pressure on plate 122 and residue portion 29 and a lateral pressure against ridge 98 and wall 100.

Special attention may be given the corner at crimping line 26 of standing ridge 98 as seen in FIG. 7. For example, a top edge 130 of member 122 may be slightly relieved from a vertical plane to permit a bottom edge 132 to better contact along the corner at line 26, forcing the outside reference edge 102 into the bottom of wall 100 along line 86.

It is incidentally seen in FIG. 7 that a light beam 135 shines upwardly through mask 74 to selectively treat portions of coating on the underside of residue portion 29 of strip 10 at each step. Between each step, frame support 66 (FIG. 6) is slightly lowered to ease pressure on strip 10 and such strip is then indexed for the next pattern generation. It should be noted that pressure plate 76 (FIG. 6) is not shown in FIG. 7 for clarity. However, after each indexing step of strip 10, the pressure plate 76 is lowered and exerts additional 36 pressure on member 122, strip 10 and the mask 74.

Reforming A Guide Member

After printing patterns on strip 10, it is convenient to wind portions thereof upon a reel having wide flanges such as output reel 62 shown in FIG. 2. However, a guide member such as a standing ridge 98 offers resistance to such a method of packaging a strip 10 for handling. Consequently, it is desirable to alter the edge guiding member by some inexpensive method such as by merely severing strip 10 along line 26.

Another method of altering standing ridge 98 is shown in FIGS. 2 and 6, illustrating that margin 28 may be restored for gripping and driving purposes. As best seen in FIG. 6, strip 10 is advanced over drive roller 108 which is advantageously smooth along its surface adjacent ridge 98. Another roller 58 for reforming the ridge 98 into the margin 28 is shown bearing upon strip 10 and upon the right top sector of drive roller 108. Roller 58 is spring biased by means (not shown) so roller 58 can be elevated and a leading portion of ridge 98 can be manually turned downward before roller 58 is applied thereupon. By cooperation of rollers 58 and 108, margin 28 is turned downward along line 26 and is restored to a substantially flat condition integral and coplanar with adjacent portions of the strip 10.

Alternate Considerations

There have been illustrated herein certain practical embodiments and applications of the invention. Nevertheless, various modifications and refinements may be made which differ from the disclosed embodiments without departing from the spirit and scope of the invention.

For example, strip 10 has been described as a delicate ribbon of copper foil on which certain patterns are made. Nevertheless, it is apparent that other strip materials may be edge guided for printing other patterns or even for other treatment utilizing the teachings of the invention.

Also, the forming of a guiding member has been described as forming a continuous standing ridge 98. Nevertheless, it is evident that ridge 98 need not be continuous but could as well be intermittent providing sufficient contact is made to a substantially continuous guiding datum such as that provided by reference wall 100. Furthermore, a guiding member need not be a standing ridge such as the ridge 98. A guiding member could have numerous other shapes including, but not limited to a rolled edge. Such a shape should provide a desired reference edge and be sufficiently strong to resist guiding forces which tend to deform residue portions of a strip.

What is claimed is:

1. A method of advancing and guiding, for printing a precise pattern therein, a flat strip having no substantial resistance to bending, comprising:

supporting the strip along a substantially straight and flat path, coextensive with and spatially related to an adjacent wall utilized as a reference datum for laterally guiding the strip;

advancing the strip along the path;

forming a standing ridge to serve as a guiding member having a reference edge along the side of the strip adjacent the reference wall such that the ridge and adjacent sheet portions have resistance to bending sufficient to protect residue portions of the sheet from unacceptable deformation;

biasing an elongate, substantially flat member upon the flat, residue portions of the strip and onto the flat path while substantially simultaneously biasing a side of the flat member against the standing ridge and onto the reference wall as the strip advances along the reference wall such that the strip follows a sufficiently precise path for printing the pattern; and altering portions of the edge guiding member after such portions have traversed the path along the reference wall so that the strip may be wound upon a reel.

2. A method as in claim 1 wherein the step of altering the edge guiding member further comprises:

reforming the member into a substantially flat condition integral and coplanar with adjacent portions of the strip.

3. A method as in claim 2 wherein the strip is made of soft copper sheet having a thickness of less than about 0.003 inch.

4. Apparatus for advancing and guiding, for printing a precise pattern therein, a flat strip having no substantial resistance to bending, comprising:

means for supporting the strip along a substantially straight and flat path, coextensive with and spatially related to an adjacent wall utilized as a reference datum for laterally guiding the strip;

means for advancing the strip along the path;

means for forming a standing ridge to serve as a guiding member having a reference edge along the side of the strip adjacent the reference wall such that the ridge and adjacent sheet portions have resistance to bending sufficient to protect residue portions of the sheet from unacceptable deformation;

means for biasing an elongate, substantially flat member upon the flat, residue portions of the strip and onto the flat path while substantially simultaneously biasing a side of the flat member against the standing ridge and onto the reference wall as the strip advances along the reference wall such that the strip follows a sufficiently precise path for printing the pattern; and means for altering portions of the edge guiding member after such portions have traversed the path along the reference wall so that the strip may be wound upon a reel.

5. Apparatus as in claim 4 wherein the means for forming the standing ridge further comprise:

a margin-turning die having an entrance and an exit end, a floor having a lineal crimping edge aligned with the reference wall and, adjacent such edge, a helical side surface extending from the entrance where a portion is coplanar with the floor and turning as such surface continues to the exit end where a portion is vertically coplanar with the reference wall, such die being so disposed that the marginal portion of the advancing strip engages the helical side surface and is turned therealong upwardly into a standing ridge parallel to and in contact with the reference wall; and a crimping roller having an axle transverse to and a rolling surface upon the advancing strip at the turning die such that the rolling surface restrains residue portions along the floor of the die and an arcuate edge of the roller contacts and crimps the margin along the crimping edge separating the floor from the helical side surface.

6. An apparatus as in claim 4 wherein the means for altering the edge guiding member further comprise:

means for reforming the member into a substantially flat condition integral and coplanar with adjacent portions of the strip.

* * * * *